Nov. 16, 1965 K. REUSCHEL ETAL 3,217,378

METHOD OF PRODUCING AN ELECTRONIC SEMICONDUCTOR DEVICE

Filed March 30, 1962

United States Patent Office 3,217,378

Patented Nov. 16, 1965

3,217,378

METHOD OF PRODUCING AN ELECTRONIC SEMICONDUCTOR DEVICE

Konrad Reuschel and Wolfgang Keller, Pretzfeld, Germany, assignors to Siemens-Schuckertwerke Aktiengesellschaft, Berlin-Siemensstadt, Germany Filed Mar. 30, 1962, Ser. No. 183,975
Claims priority, application Germany, Apr. 14, 1961, S 73,482
1 Claim. (Cl. 29—25.3)

Figure 1:
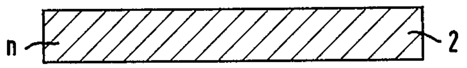

Our invention relates to a method for the production of semiconductor devices consisting of a monocrystalline semiconductor body having a plurality of layers of respectively different conductance type which form p-n junctions with each other, and provided with contact electrodes joined with the semiconductor material. In a more particular aspect, our invention concerns the method according to which such semiconductor bodies, or at least one of the above-mentioned regions thereof, is produced by monocrystalline precipitation of semiconductor material from the gaseous phase onto a heated carrier crystal consisting of semiconductor material of the same lattice structure.

It is an object of our invention to improve such semiconductor bodies and devices mechanically as well as electrically and rendering the electrical properties more resistant to mechanical stress as well as to relatively high temperatures.

To this end and in accordance with a feature of our invention we precipitate the semiconductor material in the above-described manner upon a dislocation-free carrier crystal as will be more fully explained in the following.

It is known to produce semiconductor devices by pyrolytic precipitation of monocrystalline semiconductor material upon heated carrier crystals. Such semiconductor bodies are employed for example in micro-circuitry. According to our invention such semiconductor devices or microcircuits are considerably improved by using a dislocation-free monocrystal as the carrier crystal for receiving the pyrolytic precipitation.

Dislocation-free semiconductor material possesses certain advantages which make it appear much more favorable for the production of electronic semiconductor components instead of using monocrystals containing some dislocations as the carrier body. It is relatively difficult at this time to produce material perfectly free of dislocations. However, a method for the production of such materials by crucible-free zone melting is described for example in the copending application of W. Keller et al. Serial No. 157,033, filed November 24, 1961.

It has been found that the dislocation-free semiconductor material involves difficulties in the further fabrication. Thus, for example, the alloying operations used in the known manner for producing semiconductor devices are rendered considerably more difficult when employing dislocation-free semiconductor material, since with the 111-face, usually employed, the alloying metal spreads sidewise without hindrance. This greatly increases the difficulties of controlling the size of the alloyed electrode and makes control thereof infeasible. With the present invention, these difficulties are avoided, because the semiconductor material is precipitated from the gaseous phase.

The production of semiconductor components in accordance with the known diffusion method also involves several disadvantages due essentially to the high temperatures required for such purposes. One of these disadvantages particularly is the impairment of the lifetime (diffusion length) of the minority charge carriers by the heat treatment.

The method according to our invention avoids these difficulties in producing the semiconductor devices by monocrystalline growth of semiconductor layers upon dislocation-free carrier crystals. The deposited layers, with a careful application of the method, grow without dislocation onto the dislocation-free carrier crystal and may be given, by means of a corresponding doping addition, the same or a different conductance type as the carrier crystal or the same or different conductance value.

Pyrolytic methods for the precipitation of semi-conductor material applicable for the purposes of the present invention are disclosed for example in Patent No. 3,011,877 of H. Schweikert et al. and in copending application Serial No. 90,291, filed February 20, 1961, now Patent No. 3,099,534, of H. Schweikert et al. It is preferable to precipitate semiconductor layers of the same material as that of the carrier crystal. However, the carrier crystal may also consist of a semiconductor material different from that being precipitated from the gaseous phase. For example, when germanium is pyrolytically precipitated upon a dislocation-free monocrystal of silicon, then the contacting of the germanium layer is satisfactorily possible even at relatively low temperatures and, if desired, the germanium layer can have other substances precipitated thereon. The condition for such a precipitation of different semiconductor material is that the reaction temperatures for the precipitation and deposition of the materials to be grown on the carrier crystal be lower than the melting temperature of the carrier material. In addition, the lattice constants of the carrier crystal and of the semiconductor material to be precipitated must differ only by about 5%. Accordingly, germanium can thus be precipitated upon silicon for example. Gallium-arsenide can be precipitated on germanium. Aluminum-arsenide can be precipitated on germanium as well as on silicon. Gallium arsenide can be precipitated on aluminum arsenide and vice versa. Aluminum phosphide can be precipitated on silicon, gallium phosphide upon silicon, and indium phosphide upon germanium.

The transition from one material to the other may also be effected through a mixed crystal. For example, if germanium is to be precipitated upon a silicon monocrystal, the process may be commenced with a precipitation of silicon, for example from suitable silicon compounds such as silicon tetrachloride ($SiCl_4$) or silicochloroform ($SiHCl_3$). By gradually admixing the corresponding germanium compound to the gas flow entering into the reaction chamber and correspondingly reducing the amount of the silicon compound, the gas flow can be gradually changed until it consists of germanium compound only. The silicon monocrystal is then bonded to the precipitated germanium layer by an intermediate layer consisting of a mixed crystal or solid solution of germanium in silicon. This offers the possibility of producing a monocrystalline and dislocation-free bond between semiconductor substances that exhibit some difference of their lattice constants.

The pyrolytic precipitation of semiconductor material is preferably effected, as described above, from the corresponding gaseous compounds of these substances, for example their halogenides by chemical reaction, for example with hydrogen. The precipitation of pure silicon from the gaseous phase is likewise possible.

The production of a rectifier is described as an example for the production of a semiconductor device according to the invention. For this purpose, a tape- or slab-shaped monocrystal of a given conductance type is heated, in a sealed reaction chamber, for example by passing current through the monocrystal or by heating by radiation.

The preciptation is initiated by passing a gas mixture into the reaction chamber and withdrawing the spent gases. The mixture may consist of hydrogen and one of the above-mentioned silicon or germanium compounds. Pyrolytic precipitation takes place when the monocrystalline carrier has reached a sufficient temperature in the incandescent range. For precipitation of silicon for example a temperature above 900° C. and below 1400° C., preferably in the neighborhood of 1200° C., may be employd. The gas mixture preferably contains a gaseous compound of a doping substance to produce in the precipitated material a conductance type opposite to that of the original carrier crystal. For example, n-type material can thus be precipitated upon a p-type carrier crystal by adding phosphorus chloride ($PCl_3$) to the gas mixture.

The pyrolytic precipitation is continued up to the desired thickness of the precipitated layer and is then discontinued. Excessive amounts of semiconductor material, for example material deposited at the lateral edges of the crystal slab, can be removed by etching. The localities at which no etching effect is to occur are preferably masked off for example with the aid of picein, which is a waxy substance frequently used in the semiconductor art as a masking or covering agent.

The carrier crystal may also be heated indirectly. This can be done by heating a support upon which the carrier crystal is placed. The support may consist for example of graphite, silicon or tantalum and can be heated by directly passing electric current through the support. The support may have the shape of a tape, for example, and a number of semiconductor discs already having the area size of the semiconductor devices to be produced, can be placed side by side upon the tape-shaped support and can be thickened simultaneously by precipitation of material in a reaction chamber in the above-described manner.

For producing p-n-p transistors, a tape-shaped germanium monocrystal of n-type conductance, having a specific resistance of 20 ohm·cm. and a thickness of 150$\mu$, may be chosen, for example. A p-type germanium layer is then precipitated from the gaseous phase onto the two broad sides of the monocrystal, each layer having a thickness of 20$\mu$ and a specific resistance of 0.2 ohm·cm.

An n-p-n transistor can be produced in the following manner. A p-type monocrystal of 80 to 240 ohm·cm. specific resistance, for example a silicon monocrystal having a specific resistance of 200 to 240 ohm·cm. and a thickness of 100$\mu$, may be used as a carrier body. Upon both sides of the disc- or slab-shaped dislocation-free carrier crystal a layer of n-type silicon with a thickness of 20$\mu$ and a specific resistance of 0.01 ohm·cm. is precipitated.

This can be done for example as follows:

Two silicon tapes, each 20 cm. long and 18 mm. wide, are tensioned in a reaction chamber within a vessel consisting for example of quartz glass. The two tapes are heated to a temperature of about 1100 to 1250° C. The heating can be effected inductively by high-frequency current. However, the tapes may also be heated by heat radiation or by directly passing electric current therethrough. A gaseous mixture is passed through the reaction chamber. The mixture contains hydrogen as carrier and reaction gas, and the above-mentioned silicon compounds, for example $SiCl_4$ or $SiHCl_3$. The quantity of the gas mixture passed through the chamber is approximately 0.5 to 30 liters per minute. The mole ratio of the silicon compound to hydrogen is preferably smaller than 0.14 when using silicochloroform and is preferably smaller than 0.8 when using silicon tetrachloride.

For producing the desired n-type layers of 20$\mu$ thickness, the corresponding silicochloroform mixture, for example, is conducted through the reaction chamber for approximately 5 minutes in a quantity of 8 liters per minute. The carrier gas (hydrogen) as well as the silicon compound are greatly purified before supplying them to the reaction chamber. For producing n-type conductance of the desired specific resistance, the gas flow is given an admixture of phosphorus chloride ($PCl_3$) in a quantity of $2 \cdot 10^{-4}$ gram per gram of silicochloroform.

The preferred pyrolytic temperature for precipitating germanium from the corresponding germanium compounds is about 700 to about 850° C. That is, the carrier crystal must be heated to this temperature. The walls of the reaction vessel are preferably kept at a considerably different, lower tempertaure in order to prevent precipitation at these localities.

The example described in the following relates to the production of a four-layer device of the p-n-p-n type to operate, for example, as a silicon-controlled rectifier. Used preferably is n-type silicon monocrystal having a specific resistance of 20 ohm·cm. and a thickness of 75 to 80$\mu$. Precipitated upon both sides of the flat monocrystal is a p-type layer having a thickness of 15$\mu$ and a specific resistance of 2 ohm·cm. Thereafter an n-type layer having a thickness of 15$\mu$ and a specific resistance of 0.05 ohm·cm. is deposited upon each of these two p-type layers. The precipitation can be effected from the corresponding gaseous silicon compounds as described in conjunction with the preceding examples. For obtaining the required p-type conductance, the gas mixture can be given an admixture of boron chloride ($BCl_3$). For obtaining the desired n-type conductance an admixture of phosphorus trichloride ($PCl_3$) may be added; for example $1.1 \cdot 10^{-5}$ gram $PCl_3$ per gram $SiHCl_3$.

The electric connections to the semiconductor units made in the above-described manner can be produced by precipitating nickel from a bath containing a corresponding nickel salt in solution. However, the electric conducting connections can also be made by vapor-depositing metals, for example by placing metal foils, for example gold foils, onto the unit and alloying the foil together with the semiconductor material.

In the enclosed drawing, FIGS. 1 through 5 schematically illustrate the method of preparing a p-n-p-n semiconductor device.

Figure 2:
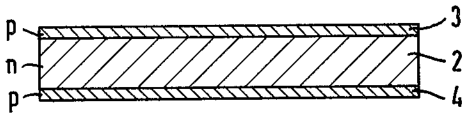
Figure 3:
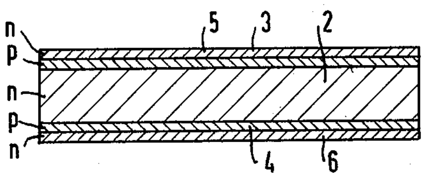

FIG. 1 shows a cross-section of an n-conducting silicon disc 2. The latter may be round or have a square or rectangular circumference. According to the first process step, two p-conducting layers 3 and 4 are deposited on the two surfaces of the disc 2. FIG. 2 shows the result. In FIG. 3 n-conducting layers 5 and 6 are applied to the p-conducting layers 3 and 4.

Figure 4:
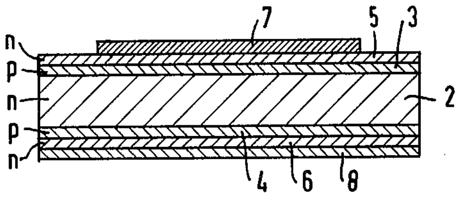
Figure 5:
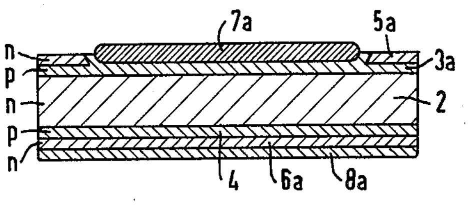

FIGS. 4 and 5 show the semiconductor device component before and after the next method step. Metal foils 7 and 8 containing doping material are applied to the surfaces of the n-conducting layers 5 and 6. Metal foil 7 contains p-type doping material, and metal foil 8 either contains n-producing doping material or is neutral. Foil 7 may comprise, for example gold-boron, and metal foil 8 may comprise gold-antimony.

In FIG. 5, the semiconductor device component is shown after the alloying of foils 7 and 8. By over-doping a portion of layer 5 with the doping material of foil 7 producing p-conductance, layer 3 increases to layer *3a*, upon which rests electrode *7a*. A remnant of layer 5 remains as zone *5a*. Nothing changes in regard to the actions of the semiconductor material, on the opposite side of the semiconductor device component. The alloying in of foil 8, produces only electrode *8a*, while layer 6 was slightly changed concerning its thickness, and now forms layer *6a*.

The active semiconductor layers *3a*, 2, 4 and *6a* form the p-n-p-n semiconductor device component.

When proceeding with the above-described method for producing a four-layer device of the p-n-p-n type, there results first a monocrystal which, due to the various steps of precipitation, comprises five alternate layers of alternately different conductance type. One or both of the outer n-type layers can be taken away or, preferably, can be eliminated by over-doping. For example a gold foil which contains boron (about 0.05% boron) and is about 30μ thick can be placed upon this outer n-type layer and can then be alloyed into that layer by heating up to a temperature of about 700° C. As a result, this n-type zone becomes over-doped and now possesses the conductance type p and a specific resistance of about 0.01 ohm cm. The gold-silicon eutectic resulting from the alloying operation and adjacent to the newly developed p-type zone may serve as contact electrode for this zone.

Preferably employed as a carrier crystal is a monocrystal of the desired shape, for example disc shape, and which was grown in such a manner or cut out of a grown crystal in such a direction that its flat sides possess (100) orientation. It has been found that the (100)-faces are particularly well suitable for monocrystalline growth of semiconductor material upon such a monocrystalline carrier body.

For preventing lattice disturbances during crystalline growth, it is sometimes of advantage to vary, each time when commencing a precipitation process, the molar ratio of the reaction gases or/and the reaction temperature for a short interval of time so that at first some semiconductor material is dissolved from the carrier crystal. This reliably secures an undisturbed surface texture of the dislocation-free carrier crystal which subsequently affords and promotes the desired monocrystalline and dislocation-free growth of the deposited layer. Details of such a method are explained in copending application Serial No. 813,583 of K. Reuschel et al. The various steps and modifications described in that application, as well as those disclosed in the copending application Serial No. 737,254, now Patent No. 3,042,494, of H. Gutsche, both assigned to the assignee of the present invention, can be advantageously combined with the method of the present invention. If desired, the concentration of the added gaseous compound of a doping substance can also be varied in order to obtain a continuous change in doping concentration of the semiconductor material being precipitated.

Electronic semiconductor devices produced in accordance with the invention have the following advantages. The p-n junctions in the semiconductor device are perfectly parallel to each other and therefore afford the production of uniformly thick zones of the semiconductor body. The precipitated semiconductor material, like the fundamental body serving as a carrier crystal, is completely free of dislocations and therefore is mechanically very rugged. Such semiconductor devices, when being subjected to subsequent fabricating operations, in which for example contact electrodes are attached, or the semiconductor devices are fastened on a heat sink or cooling body or are mounted in a capsule, need not be as carefully treated as semiconductor devices consisting of material possessing dislocations. Due to the absence of dislocations, a gliding in the lattice planes is prevented up to relatively high temperatures. For that reason the subsequent fabricating operations, which in most cases involve heating, can be performed with considerably higher spatial temperature gradients without new formation of dislocations. Shearing stresses become permissible that are approximately 1000 times higher than those permissible with material possessing dislocations. In contrast, when semiconductor devices are produced exclusively by the alloying method, dislocations occur in the recrystallization zones resulting from alloying, even if a dislocation-free body is used as fundamental semiconductor body.

We claim:

The method of preparing a p-n-p-n electronic semiconductor device, which comprises pyrolytically precipitating p-type silicon upon each side of a dislocation-free n-type silicon carrier, thereafter pyrolytically precipitating n-type silicon on each p-type layer and attaching an acceptor-containing electrode to one of said n-type layers to over-dope said layer and attaching an electrode to the other of said n-type layers.

References Cited by the Examiner

UNITED STATES PATENTS

| | | | |
|---|---|---|---|
| 2,928,162 | 3/1960 | Marinace | 29—25.3 |
| 2,940,022 | 6/1960 | Pankove | 29—25.3 X |
| 2,961,305 | 11/1960 | Dash | 148—1.6 X |
| 3,014,820 | 12/1961 | Marinace | 148—1.5 |
| 3,047,438 | 7/1962 | Marinace | 29—25.3 X |
| 3,065,113 | 11/1962 | Lyons | 29—25.3 X |
| 3,065,392 | 11/1962 | Pankove | 29—25.3 X |
| 3,076,731 | 2/1963 | Mannlund | 148—1.5 |
| 3,135,585 | 6/1964 | Dash | 148—1.6 X |

FOREIGN PATENTS 638,235 3/1962 Canada.

OTHER REFERENCES

Dash: "Growth of Si Crystals," Journal of Applied Physics, vol. 30, April 1959, p. 459+, QC 1 J82.

Anderson et al.: "Graded Concentration Semiconductor," IBM Technical Disclosure, vol. 3, September 1960, pp. 32–33.

Transistor Technology, New York, 1958, vol. 1, Chapter 2, pp. 43–44.

Ingham et al.: "Dislocation Content in Vapor-Grown Ge Crystals," IBM Journal of Research and Development, vol. 4, No. 30, July 1960, pp. 302, 303.

RICHARD H. EANES, Jr., *Primary Examiner.*